(12) United States Patent
Park et al.

(10) Patent No.: US 8,217,401 B2
(45) Date of Patent: Jul. 10, 2012

(54) LIGHT EMITTING DEVICE USING NANO SIZE NEEDLE

(75) Inventors: Noe-jung Park, Suwon-si (KR);
Sung-hoon Lee, Yongin-si (KR);
Hyo-sug Lee, Suwon-si (KR);
Young-Gu Jin, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/716,733

(22) Filed: Mar. 3, 2010

(65) Prior Publication Data

US 2010/0155695 A1 Jun. 24, 2010

Related U.S. Application Data

(62) Division of application No. 11/144,702, filed on Jun. 6, 2005, now Pat. No. 7,700,953.

(30) Foreign Application Priority Data

Jun. 5, 2004 (KR) .................. 10-2004-0041185

(51) Int. Cl.
*H01L 27/15* (2006.01)
*H01L 29/26* (2006.01)

(52) U.S. Cl. .............. 257/79; 257/90; 257/99; 257/103; 445/58

(58) Field of Classification Search .................. 257/79, 257/90, 99, 103; 445/58
See application file for complete search history.

(56) References Cited

U.S. PATENT DOCUMENTS

| 5,332,910 | A | 7/1994 | Haraguchi et al. |
| 5,908,585 | A | 6/1999 | Shibuta |
| 6,023,128 | A * | 2/2000 | Grothe et al. ................. 313/506 |
| 6,878,871 | B2 | 4/2005 | Scher et al. |
| 6,919,119 | B2 | 7/2005 | Kalkan et al. |
| 2002/0036452 | A1 | 3/2002 | Muroyama et al. |
| 2002/0151094 | A1 | 10/2002 | Andriessen |
| 2005/0194598 | A1* | 9/2005 | Kim et al. ....................... 257/79 |

FOREIGN PATENT DOCUMENTS

| JP | 2002-305087 A | 10/2002 |
| JP | 2004-55484 A | 2/2004 |
| KR | 1999-0064113 | 7/1999 |
| KR | 10-2002-0054883 A | 7/2002 |

(Continued)

OTHER PUBLICATIONS

C.J. Lee, J. Park, S. Han, J. Ihm, "Growth and field emission of carbon nanotubes on sodalime glass at 550°C using thermal chemical vapor deposition", Chemical Physics Letters, 337 (2001) 398-402.

(Continued)

*Primary Examiner* — Kenneth Parker
*Assistant Examiner* — Dale E Page
(74) *Attorney, Agent, or Firm* — Sughrue Mion, PLLC

(57) ABSTRACT

A light-emitting device that improves the injection efficiency of electrons or holes by providing electrons or holes to an emitting layer using nano size needles, including a first electrode with a first polarity a second electrode with a second polarity opposite to the first polarity an emitting layer interposed between the first electrode and the second electrode to emit light and a plurality of conductive needles inserted in the first electrode and extending toward the emitting layer.

7 Claims, 6 Drawing Sheets

FOREIGN PATENT DOCUMENTS

| KR | 10-2002-0091640 A | 12/2002 |
|---|---|---|
| KR | 10-2004-0014352 A | 2/2004 |

OTHER PUBLICATIONS

C.X. Xu, X.W. Sun and B.J. Chen, "Field-emission from gallium-doped zinc oxide nanofiber array" Applied Physics Letters, 84, 1540(2004).

Applied Physics Letters, 84, 1540(2004). M.J. Fransen, V. Rooy, P. Kruit, "Field-emission energy distributions from individual multiwalled carbon nanotubes", Applied Surface Science 146(1999) 312-327.

Ming Yu, N. Lang, B. Hussey and T.H. Chang, "New Evidence for Localized Electronic States on Atomically Sharp Field Emitters", Physical Review Letters, Aug. 19, 1996, vol. 77, No. 8, pp. 1636-1639.

N. K. Patel, S. Gina, J.H. Burroughes, "High-Efficiency Organic Light-Emitting Diodes", IEEE Journal on Selected Topics in Quantum Electronics, vol. 8, No. 2, pp. 346-361, Mar./Apr. 2002.

S.H. Jo, J.Y. Lao, Z.F. Ren, R.A. Farrer, T. Baldacchini et al., "Field-emission studies on thin films of zinc oxide nanowires", Applied Physics Letters, 83, 4821(2003).

W.B. Choi, D.S. Chung, J.H. Kang, H.Y. Kim, Y.W. Jin, et al., "Fully sealed, high-brightness carbon-nanotube field-emission display", Applied Physics Letters, 75, 3129(1999).

* cited by examiner

LIGHT EMITTING DEVICE USING NANO SIZE NEEDLE

CROSS-REFERENCE TO RELATED APPLICATION

This is a divisional of application Ser. No. 11/144,702 filed Jun. 6, 2005. The entire disclosure of the prior application, application Ser. No. 11/144,702 is hereby incorporated by reference.

BACKGROUND OF THE INVENTION

1. Field of the Invention

The present invention relates to a light-emitting device using nano size needles, and more particularly, to a light-emitting device that improves injection efficiency of electrons or holes by providing electrons or holes to an emitting layer using nano size needles.

2. Description of the Related Art

Inorganic electroluminescence (EL) devices and organic EL devices have been developed as alternatives to displays such as cathode ray tubes (CRTs) or liquid crystal displays (LCDs). The inorganic EL devices are classified into alternating current types and direct current types. The alternating current inorganic EL device is a light-emitting device in which electrons accelerated by a high voltage collide with transition metal ions in a fluorescent substance dispersed in an organic binder such as a semiconductor, to emit light. A direct current inorganic EL device is a light-emitting device in which an electron and a hole are recombined in a p-n configuration of an inorganic semiconductor to emit light. On the other hand, the organic EL device is a light-emitting device in which electrons and holes are injected into organic materials from electrodes and the electrons and the holes are recombined in the organic matter to emit light. Organic EL devices can be widely utilized due to advantages such as response speeds as fast as those of CRTs, high brightness, low power consumption, wide viewing angle, and super thin film.

FIG. 1 schematically illustrates a conventional configuration of an organic EL device. Referring to FIG. 1, an organic EL device 100 includes an emitting layer 130 interposed between an anode 150 and a cathode 110, a hole transporting layer (HTL) 140 interposed between the anode 150 and the emitting layer 130 in order to improve injection efficiency of holes, and an electron transporting layer (ETL) 120 interposed between the cathode 110 and the emitting layer 130 in order to improve injection efficiency of electrons. In this configuration, the operation of the organic EL device is classified into (1) the operation of injecting electrons and holes into the emitting layer, (2) the operation of radiative recombination of electrons and holes, and (3) the operation of transmitting light to the outside.

The injection efficiency of electrons and holes need to be improved in order to improve the luminous efficiency of an organic EL device. Conventional techniques to improve the injection efficiency of electrons and holes include treating the surface of an electrode, or interposing an intermediate layer such as an electron injection layer, an electron transporting layer, or a blocking layer, between an electrode and an emitting layer. For example, in order to provide holes from an anode to an emitting layer, the work function of the anode must be high enough, and in order to provide electrons from a cathode to an emitting layer, the work function of the cathode must be low enough. Since materials that are stable and satisfy the requirement as describe above are difficult to obtain, a work function of an electrode is often increased or lowered using proper surface treatment. However, there is a limit to the increase or decrease of a work function using surface treatments, and the manufacturing process can be complicated. Accordingly, a new method is required to improve to injection efficiency of electrons and holes from electrodes to an emitting layer.

SUMMARY OF THE INVENTION

The present invention provides a light-emitting device in which injection efficiency of electrons from an electrode to an emitting layer is greatly improved. That is, a light-emitting device improving injection efficiency using nano size needles is provided.

Consistent with an aspect of the present invention, there is provided a light-emitting device including: a first electrode having a first polarity; a second electrode having a second polarity opposite to the first polarity; an emitting layer interposed between the first electrode and the second electrode to emit light; and a plurality of conductive needles inserted in the first electrode extending toward the emitting layer. In an exemplary embodiment, the diameter of the conductive needles may be less than 100 nm. Also at least one of the first electrode and the second electrode may be a transparent electrode.

When the first electrode is a cathode and the second electrode is an anode, a hole blocking layer composed of a nonconductive material having a larger ionization energy than the emitting layer may be interposed between the first electrode and the emitting layer in order to prevent deterioration of the emitting layer and prevent holes from transferring to the first electrode. The hole blocking layer may surround the ends of the conductive needles. A distance between the interface between the emitting layer and the hole blocking layer and the ends of the conductive needles may be less than 10 nm.

An electron blocking layer having a smaller electron affinity than the emitting layer may be interposed between the emitting layer and the second electrode in order to prevent electrons from transferring from the emitting layer to the second electrode. The electron blocking layer may have a smaller electron affinity than the emitting layer.

On the other hand, the emitting layer and the second electrode may be composed of a p-doped inorganic semiconductor layer, and the surface of the p-doped inorganic semiconductor layer is doped to a high density.

When the first electrode is an anode and the second electrode is a cathode, an electron blocking layer composed of a nonconductive material having a smaller electron affinity than the emitting layer may be interposed between the first electrode and the emitting layer in order to prevent deterioration of the emitting layer and prevent electrons from transferring from the emitting layer to the first electrode.

A hole blocking layer having a larger ionization energy than the emitting layer may be further interposed between the emitting layer and the second electrode in order to prevent holes from transferring from the emitting layer to the second electrode.

The emitting layer and the second electrode may be composed of an n-doped inorganic semiconductor layer. In this case, the surface of the n-doped inorganic semiconductor layer may be doped by the highest density.

Consistent with another aspect of the present invention, there is provided a light-emitting device including: a cathode providing electrons; an anode providing holes; an emitting layer interposed between the cathode and the anode to emit light; a plurality of first conductive needles inserted in the cathode and extending toward the emitting layer; and a plurality of second conductive needles inserted in the anode and extending toward the emitting layer.

Consistent with still another aspect of the present invention, there is provided a light-emitting device including: a first electrode which has a first polarity; a plurality of semiconducting nano needles that are inserted in the first electrode; an intermediate layer that is deposited on the first electrode to keep electrons and holes in the nano needles; and a second electrode that has a second polarity opposite to the first polarity.

When the first electrode is an anode and the second electrode is a cathode, the intermediate layer may be composed of a material having a larger electron affinity and a larger ionization energy than the nano needles. When the first electrode is a cathode and the second electrode is an anode, the intermediate layer may be composed of material that has a smaller electron affinity and a smaller ionization energy than the nano needle. In this case, the intermediate layer may surround the ends of the nano needles. The intermediate layer may be an insulating layer, and the ends of the nano needles may penetrate the intermediate layer and be connected to the second electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Since a strong electric field is generated around an end of a nano-sized conductive needle when a voltage is applied, electrons are emitted well at a low temperature even when the applied voltage is low. This occurs because a quantum mechanical energy barrier through which electrons or holes pass, is very thin at an end of a conductive needle. Consistent with an embodiment of the present invention, using such a phenomenon, electrons, holes, or electrons and holes are injected into an emitting layer via a nano-sized metallic or highly conductive needle (hereinafter, referred to as a nano needle).

Figure 1:
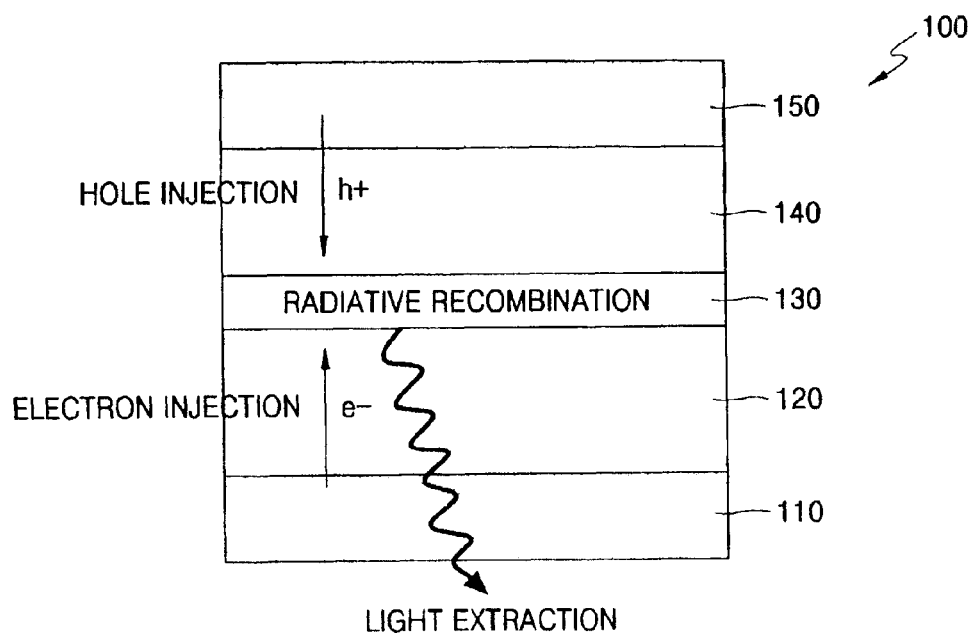
FIG. 1 is a diagram illustrating a configuration of a conventional organic EL device.
Figure 2:
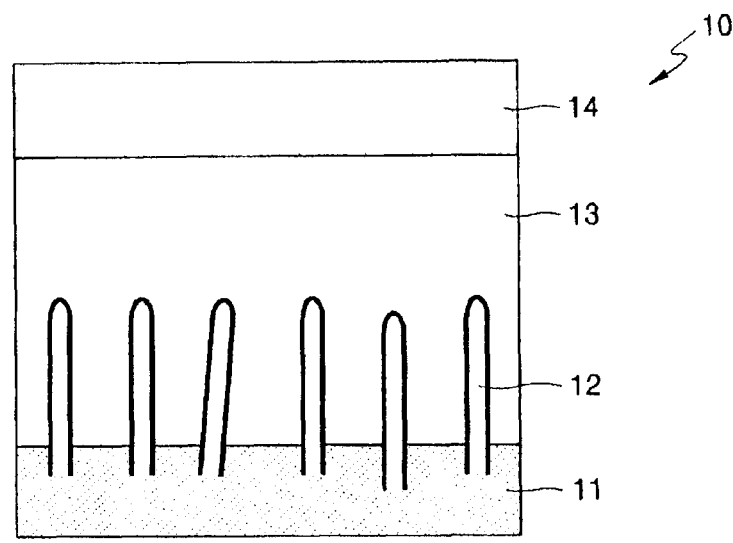
FIG. 2 is a cross-sectional view schematically illustrating a light-emitting device using nano size needles consistent with an embodiment of the present invention.

FIG. 2 is a diagram schematically illustrating a configuration of a light-emitting device 10 using nano needles according to an embodiment of the present invention. Referring to FIG. 2, the light-emitting device 10 includes a cathode 11 and an anode 14 above and below an emitting layer 13 respectively, and a plurality of conductive nano needles 12 disposed in the light-emitting device 10. One end of each of the nano needles 12 is inserted in the cathode 11 and the remaining part of the nano needles 12 are covered by the emitting layer 13. That is, a plurality of metallic or highly conductive nano needles are planted on a cathode of a conventional EL device.

The emitting layer 13 can be formed of a general light-emitting material used in organic EL devices or inorganic EL devices. For example, in case of an organic EL device, according to light-emitting color, the light-emitting material can be formed of a monomolecular organic EL material such as Alq3 or Anthracene and a polymer such as poly(p-phenylenevinylene) (PPV), polythiophene (PT), or a derivative of PPV or PT. Also, in case of an alternating current inorganic EL device, the light-emitting material can be formed of a powder of a fluorescent substance such as ZnS which is dispersed in a binder such as cyanoethylcellulose and in which Cu, Cl, I, or Mn atoms are added as an activator depending on the desired color of emitting light. As inorganic material, for example, Si, GaN, or the quantum configuration of Si or GaN may be used.

In order to transmit light generated by the emitting layer 13, one or more of the two electrodes 11 and 14 may be composed of a transparent material such as ITO. The other electrode may be formed of a metal such as Pt or Al.

The nano needles 12 need not be vertically inserted in the cathode 11 and need not have uniform density. The ends of the nano needles 12 must be separated from each other such that a powerful electric field is applied to the ends of the nano needles 12 to emit electrons. Because the diameter of the nano needles 12 is less than 100 nm (The diameter may be less than 10 nm), although not uniformly arranged, the nano needles 12 appear to be uniformly arranged when observed with the naked eye. Accordingly, the nano needles 12 can be inserted in the cathode 11 by a simple process. Generally, the nano needles 12 may be composed of carbon nano tubes (CNT) or metallic or semiconductive nanowires.

In this configuration, as described above, even if a small voltage is applied to the nano needles 12, electrons are easily emitted from the ends of the nano needles 12, thereby directly injecting electrons into the emitting layer 13. Accordingly, the efficiency of injecting electrons to the emitting layer 13 is improved.

Figure 3:
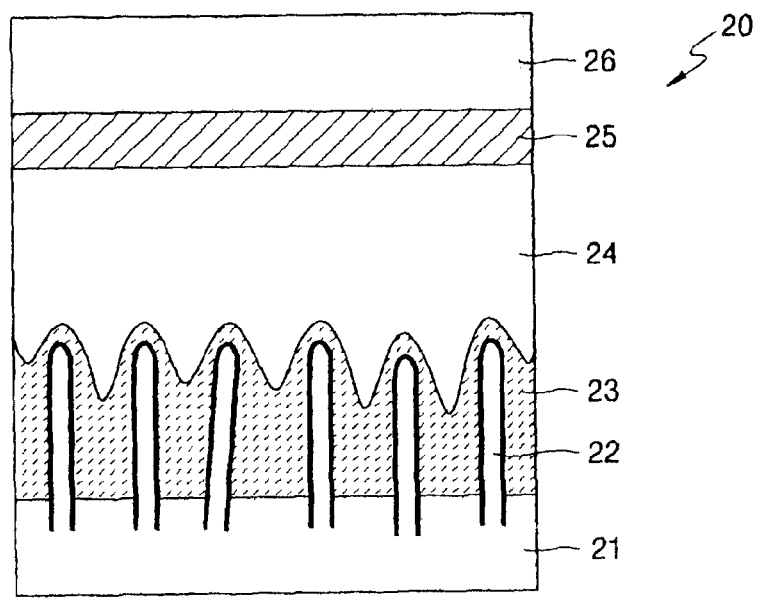
FIG. 3 is a cross-sectional view schematically illustrating a light-emitting device using nano size needles consistent with another embodiment of the present invention.

FIG. 3 schematically illustrates the configuration of a light-emitting device using nano needles according to another embodiment of the present invention. A light-emitting device 20 includes a hole blocking layer 23 interposed between anode 21 and an emitting layer 24. In the previous embodiment, when the nano needle 12 is directly covered by the emitting layer 13, the emitting layer is deteriorated by a powerful electric field and a current around the nano needles 12. Moreover, holes which are injected from the anode 14 to the emitting layer 13 can not be recombined with the electrons injected from the nano needles 12 and flow easily to the cathode 11 via the nano needles 12. However, in the present embodiment, the hole blocking layer 23 prevents the emitting layer from deterioration and prevents hole movement from the emitting layer 24 to the cathode 21.

The hole blocking layer 23 may be composed of a thermostable insulating material having a greater ionization potential than the emitting layer 24. Also, since electrons should be transferred from the cathode 21 to the emitting layer 24, the electron affinity of the hole blocking layer 23 may be between the electron affinities of the emitting layer 24 and the cathode 21. The hole blocking layer 23 may be composed of fluorides such as Lif or CsF, various oxides, and sulphides.

The hole blocking layer 23 surrounds the ends of the nano needles 22 such that the nano needles 22 do not contact the emitting layer 24. However, if the hole blocking layer 23 is excessively thick, electrons extracted from the ends of the nano needles 22 can not be injected into the emitting layer 24. Accordingly, a distance between the interface of the emitting layer 24 and the hole blocking layer 23, and the ends of the nano needle 22, may be less than 10 nm.

Consistent with the present embodiment, holes provided from the anode 26 to the emitting layer 24 cannot pass through the hole blocking layer 23 and are concentrated and distributed on the interface between the emitting layer 24 and the hole blocking layer 23. Accordingly, the electrons emitted from the ends of the nano needles 22 can be more easily recombined with the holes in the emitting layer 24, thereby improving light-emitting efficiency. Also, since the nano needles 22 do not directly contact the emitting layer 24, deterioration of the emitting layer 24 is prevented, thereby increasing the life span of the light-emitting device 20.

In spite of the configuration, it is still possible that the electrons injected from the nano needle 22 to the emitting layer 24 cannot recombine with holes and flow to the anode 26. To prevent this problem, referring to FIG. 3, in another embodiment of the present invention, an electron blocking layer 25 may be interposed between the anode 26 and the emitting layer 24. The electron blocking layer 25 prevents electrons in the emitting layer 24 from transferring to the anode 26. To this end, the electron blocking layer 24 has a smaller electron affinity than the emitting layer 24. The electron blocking layer 25 may be composed of MEH-PPV or PEDOT:PSS, or the electron blocking layer 25 may be formed by performing plasma treatment on the surface of the anode 26 in an oxide atmosphere.

Figure 4:
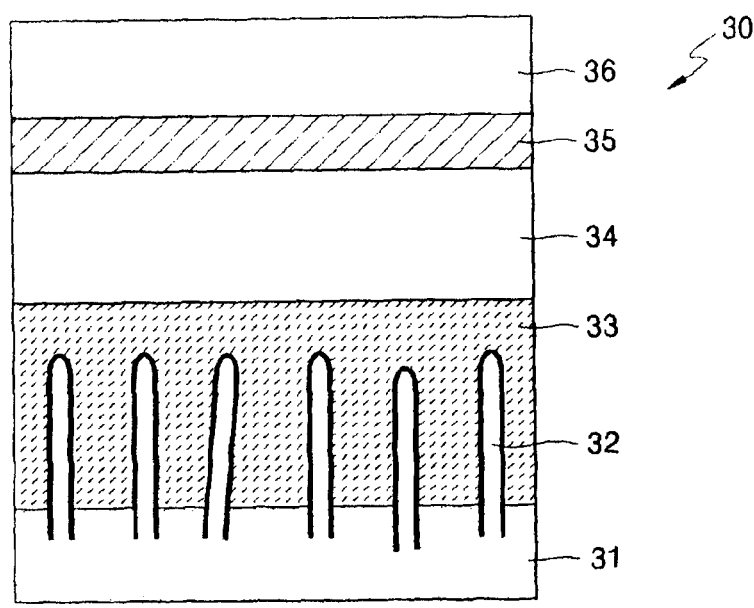
FIG. 4 is a cross-sectional view schematically illustrating a light-emitting device using nano size needles consistent with another embodiment of the present invention.

FIG. 4 schematically illustrates a configuration of a light-emitting device using nano needles according to another exemplary embodiment of the present invention. The light-emitting device 30 includes an electron transporting layer (ETL) 33 interposed between cathode 31 and an emitting layer 34, which provides a similar result to the hole blocking layer 23 interposed between the cathode 21 and the emitting layer 24. The ETL 33 performs all the functions of the hole blocking layer 23 and further performs functions that makes it easy to inject electrons from the cathode 31 into the emitting layer 34. That is, the ETL 33 prevents deterioration of the emitting layer 34, prevents holes from transferring from the emitting layer 34 to the cathode 31, and facilitates the injection of electrons into the emitting layer 34. Also, the ETL 33 separates the cathode 31 from the emitting layer 34, thereby preventing light from being extinguished.

The ETL 33 may be composed of a thermostable conductive material having a greater ionization energy than the emitting layer 34. Also, electron affinity of the ETL 33 may be between those of the emitting layer 34 and the cathode 31 such that electrons are received from the cathode 31 and transferred to the emitting layer 34. As with the hole blocking layer 23, the ETL 33 completely surrounds the ends of the nano needles 32. However, as opposed to the hole blocking layer 23, it is not necessary that a distance between the interface between the emitting layer 34 and the ETL 33 and the ends of the nano needle 32 be under 10 nm. Electrons generated at the ends of the nano needle 32 may be more easily transferred from the ETL 33 to the emitting layer 34 than from the hole blocking layer 23 to the emitting layer 24 in the previous embodiment. The ETL 33 may be composed of an oxadiazole derivative or a perylene derivative.

Also, referring to FIG. 4, a hole transporting layer (HTL) 35 which corresponds to the ETL 33 may be interposed between the anode 36 and the emitting layer 34. The HTL 35 performs the same functions as the electron blocking layer 25 of FIG. 3 and simultaneously injects holes provided from the anode 36 into the emitting layer 34. Accordingly, the HTL 35 may be composed of a conductive material having a smaller electron affinity than the emitting layer 34. For example, the HTL 35 may be composed of triphenyl-diamine, which is derivative of diamine, poly(9-vinylcarbazole), which is a photoconductive polymer, PEDOT-PSS, or a p-doped semiconductor, such as p-GaN.

When the ETL 33 and the HTL 35 are used with the nano needles 32, quantum efficiency is improved, and a driving voltage is further reduced since electrons and holes are not directly injected but pass the ETL 33 and the HTL 35. Also, when electrons and holes injected into the emitting layer 34 pass through the emitting layer 34 and are transferred to an opposite electrode, the electrons and holes are blocked by an opposite transporting layer, thereby controlling recombination. Therefore, luminous efficiency may be improved. In addition, since singlet excitons generated by the recombination of electrons and holes are formed at the interfaces between the electrodes 31 and 36 and the emitting layer 34, deceleration of luminescence can be prevented.

Figure 5A:
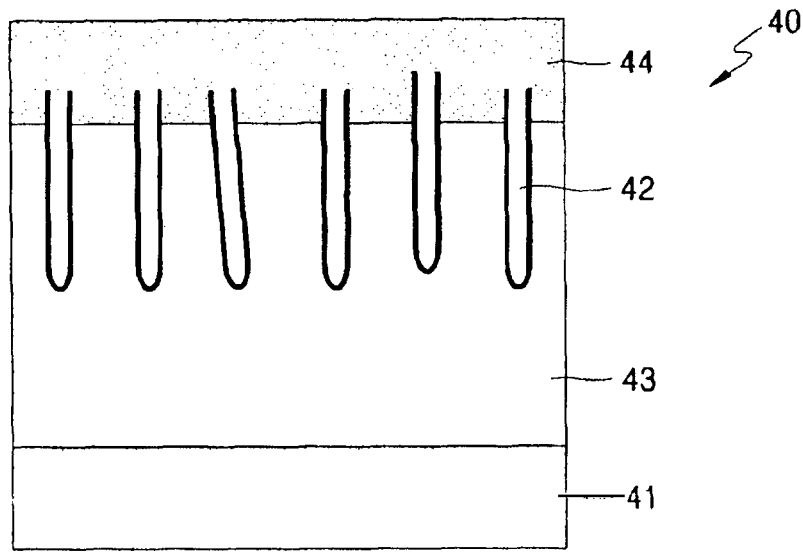
FIGS. 5A through 5C are cross-sectional views schematically illustrating light-emitting devices using nano size needles consistent with embodiments of the present invention.

Hitherto, configurations in which nano needles are formed on cathodes and electrons are emitted from the nano needles have been described. However, it is possible to form the nano needles on anodes and to emit holes from the nano needles. FIG. 5A is a diagram illustrating another embodiment of the present invention, in which nano needles are formed on an anode. Referring to FIG. 5A, the light-emitting device 40 includes an emitting layer 43 interposed between a cathode 41 and an anode 44. The nano needles 42 are inserted in the anode 44 and extend toward the emitting layer 43. When an anode voltage is applied to nano needles, a powerful electric field occurs around the ends of the nano needle. Holes are easily emitted from the nano needles 42 even when the applied voltage is small and the temperature is low.

Figure 5B:
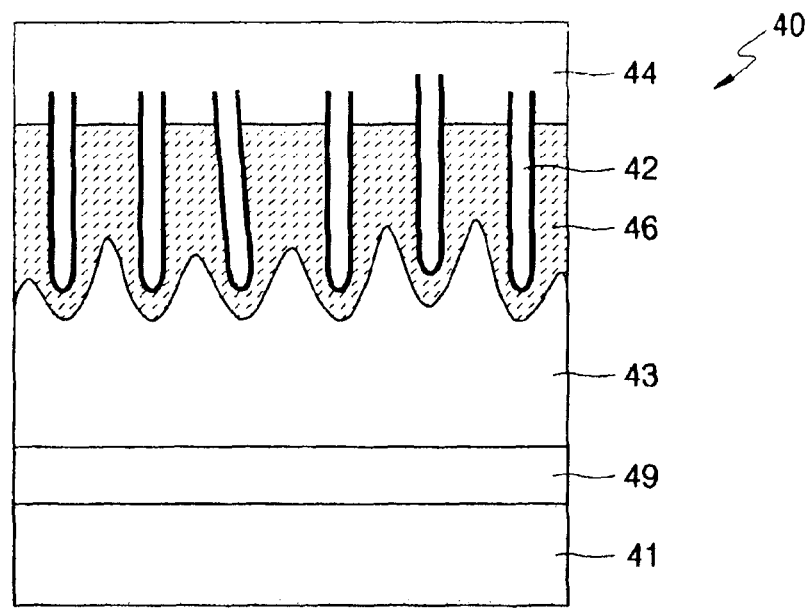

In this case, similarly to the embodiment illustrated in FIG. 3, an electron blocking layer 46 may be interposed between the anode 44 and the emitting layer 43. FIG. 5B illustrates a configuration of a light-emitting device consistent with another embodiment of the present invention. In order to prevent the emitting layer 43 from being deteriorated by a powerful electric field and a current around the nano needles 43 and to prevent electrons from transferring from the emitting layer 43 to the anode 44, an electron blocking layer 46 is interposed between the anode 44 and the emitting layer 43. The electron blocking layer 46 is composed of a thermostable insulating material and has a smaller electron affinity than the emitting layer 43. The electron blocking layer 46 surrounds the ends of the nano needles 42 such that the nano needles 42 do not contact the emitting layer 43. In this case, since it is possible that holes emitted from the ends of the nano needle 42 cannot be injected into the emitting layer 43 if the electron blocking layer 46 is too thick, a distance between the interface of the emitting layer 43 and electron blocking layer 46, and the end portion of the nano needle 42, may be less than 10 nm.

To prevent holes emitted from the nano needles 42 from flowing to the cathode 41, a hole blocking layer 47 may be interposed between the cathode 41 and the emitting layer 43. The hole blocking layer 47 has a larger ionization energy than the emitting layer 43. Also, since electrons are received from the cathode 41 and transferred to the emitting layer 43, the electron affinity of the hole blocking layer 47 is between those of the emitting layer 43 and the cathode 41.

Figure 5C:
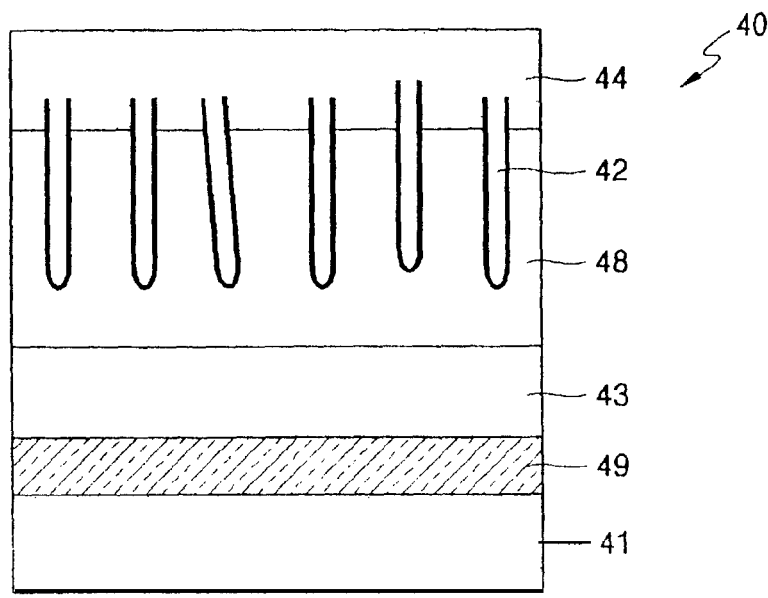

FIG. 5C illustrates an embodiment similar to the embodiment illustrated in FIG. 4, in which an HTL 48 and an ETL 49 are further included in order to facilitate the injection of electrons and holes. Referring to 5C, the HTL 48 is interposed between the anode 44 and the emitting layer 43 to entirely cover the nano needles 42, and the ETL 49 is interposed between the cathode 41 and the emitting layer 43. The ETL 49 is composed of a thermostable conductive material having a larger ionization energy than the emitting layer 43, and the HTL 48 is composed of a thermostable conductive material having a smaller electron affinity than the emitting layer 43. The ETL 49 and the HTL 48 can be composed of the same materials as the ETL 33 and HTL 35 of FIG. 4, respectively.

Figure 6A:
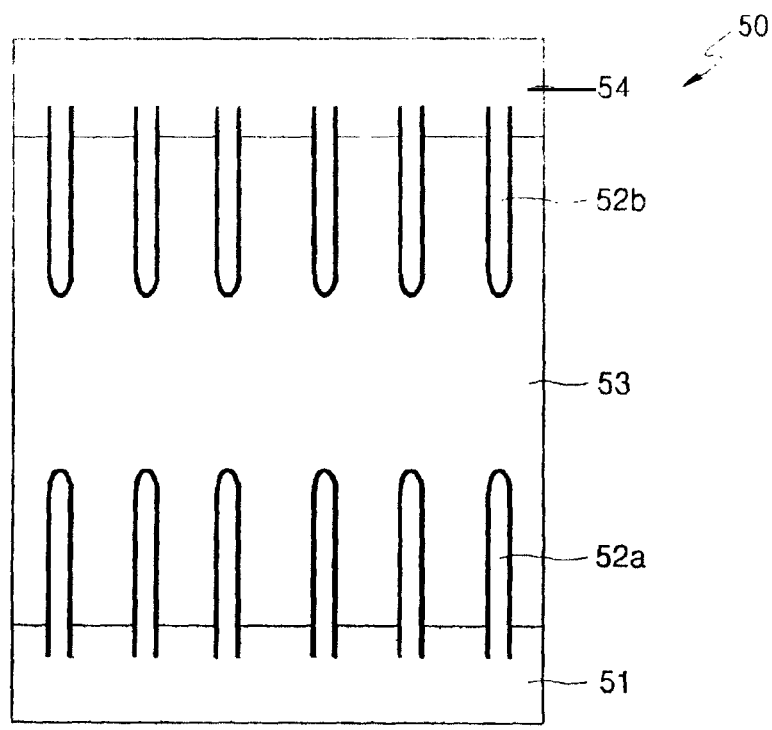
FIGS. 6A and 6B are cross-sectional views schematically illustrating light-emitting devices using nano size needles consistent with embodiments of the present invention.

Referring to FIG. 6A, consistent with another embodiment of the present invention, nano needles 52a and nano needles 52b are formed on a cathode 51 and an anode 54, respectively. In this case, the nano needles 52a formed on the cathode 51 emit electrons, and the nano needles 52b formed on the anode 54 emit holes. Since both electrons and holes are injected into the emitting layer 53 via the nano needles 52a and 52b, superior electron injection efficiency can be obtained.

Figure 6B:
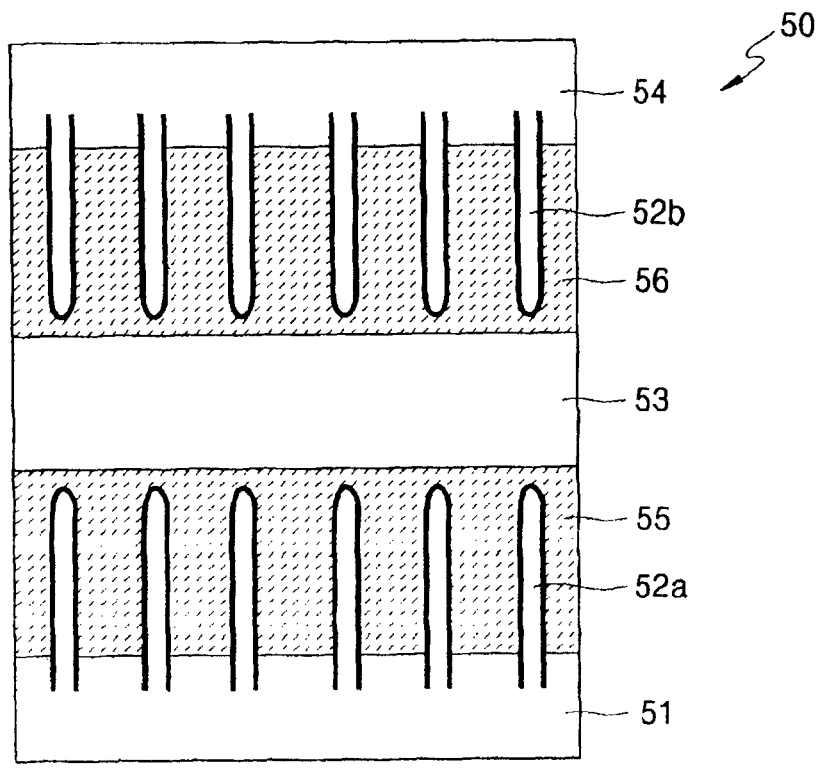

Referring to FIG. 6B, consistent with another exemplary embodiment of the present invention, a hole blocking layer 55 is interposed between the emitting layer 53 and the cathode 51 to cover the nano needles 52a, and an electron blocking layer 56 is interposed between the emitting layer 53 and the anode 54 to cover the nano needles 52b. Instead of the HTL 55 and ETL 56, an electron transporting layer and a hole transporting layer may be used. In this case, the layers may be composed of the same materials as the layers described in previous embodiments.

Figure 7:
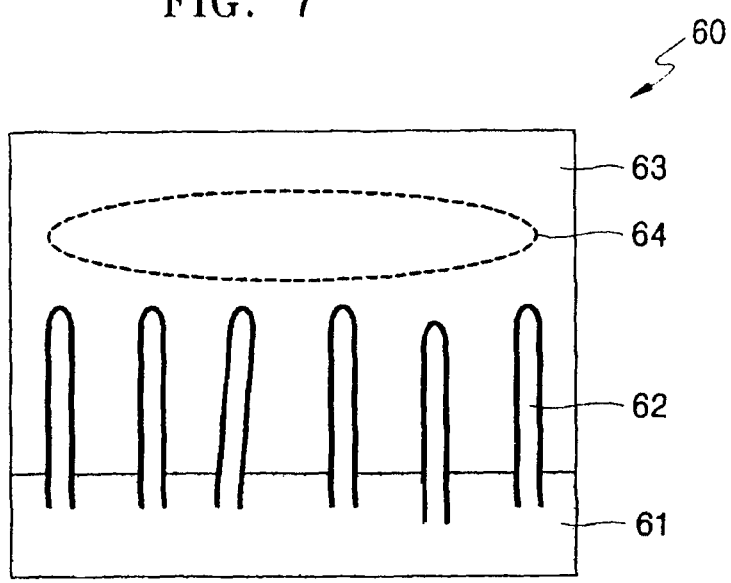
FIG. 7 is a cross-sectional view schematically illustrating a light-emitting device using nano size needles consistent with an embodiment of the present invention.

The principals of the present invention described above may be also applied to a light-emitting device using an inorganic semiconductive material that emits light when an electric field is applied. FIG. 7 illustrates a light-emitting device 60 using an inorganic semiconductor consistent with another embodiment of the present invention. Referring to FIG. 7, the light-emitting device includes a p-doped inorganic semiconductor layer 63 deposited on a cathode 61, and nano needles 62 extending into the p-doped inorganic semiconductor layer 63 from the cathode 61. Here, inorganic semiconductors such as GaN, ZnS, and SiC can be generally used. In this case, when the doping density of the surface of the inorganic semiconductor layer 63 is very high, the surface of the inorganic semiconductor 63 may become an anode.

In the configuration described above, when an anode voltage is applied to the surface of the inorganic semiconductor layer 63 and a cathode voltage is applied to the cathode 61, electrons and holes are provided to the inorganic semiconductor layer 63. Then, the electrons meet and recombine with the holes in a light-emitting region 64 in the inorganic semiconductor layer 63, thereby generating light. In this case, the nano needles 62 facilitate the injection of the electrons into the p-doped inorganic semiconductor layer 63 even when a small voltage is applied.

Although not shown in FIG. 7, similar to previously described embodiments, a hole blocking layer or an electron blocking layer with a higher ionization energy than the inorganic semiconductor layer 63 may be interposed between the inorganic semiconductor layer 63 and the cathode 61. Thus the holes are prevented from transferring to the cathode 61 via the hole blocking layer or the ETL, and the inorganic semiconductor layer 63 is protected from a strong electric field and current generated by the ends of the nano needle 62. Consistent with another embodiment of the present invention, an emitting layer and an anode are formed in a single body composed of one p-doped inorganic semiconductor.

The emitting layer and cathode may be formed in a single body composed of an n-doped inorganic semiconductor. In this case, the surface of the n-doped inorganic semiconductor layer is doped with the highest density, thereby playing a roll of a cathode. Then, an anode is formed on the n-doped inorganic semiconductor layer, and nano needles are covered between the anode and the n-doped inorganic semiconductor layer. Also, an electron blocking layer or an HTL having a smaller electron affinity than the semiconductor layer may be interposed between the inorganic semiconductor layer and the anode.

Figure 8:
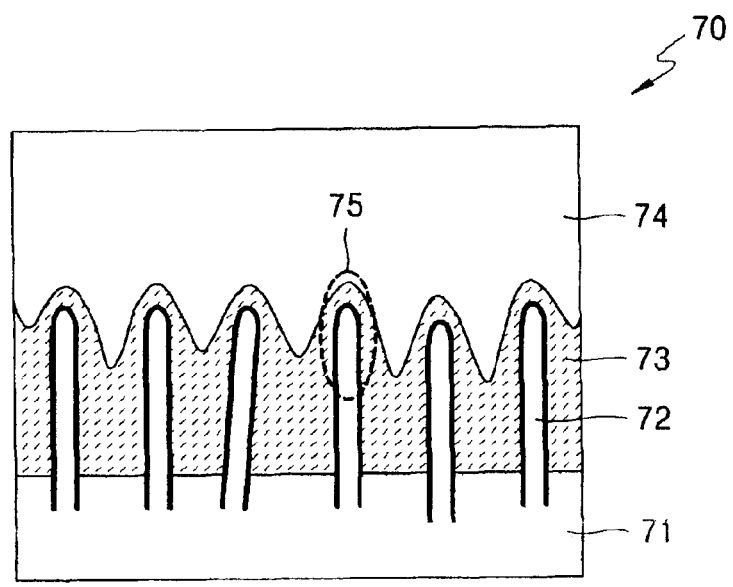
FIG. 8 is a cross-sectional view schematically illustrating a light-emitting device using nano size needles consistent with an embodiment of the present invention.

The nano needles themselves may also be used to produce light. For example, a semiconducting nano bar may emit light at a low voltage. FIG. 8 illustrates another embodiment of the present invention, in which the nano needles are used to generate light. Referring to FIG. 8, a light-emitting device 70 consistent with another embodiment of the present invention includes semiconducting nano needles 72 inserted in cathode 71, an intermediate layer 73 formed on the cathode 71 and surrounding the semiconducting nano needles 72 to keep electrons in the nano needles 72, and facilitate the flow of holes into the nano needles 72, and an anode 74 formed on the intermediate layer 73. In this case, the intermediate layer 73 may be composed of insulating materials having a smaller electron affinity and ionization energy than the nano needles 72 such that electrons are not emitted from the nano needles 72 and holes flow easily into the nano needles 72 from the anode 74. Also, a distance between interface of the anode 74 and the intermediate layer 73, and the ends of the nano needle 72, may be less than 10 nm such that holes injected from the anode 74 flow into the nano needles 72 via the intermediate layer 73.

In this configuration, when a voltage is applied to the anode 74 and the cathode 71, electrons transferred from the cathode 71 to the nano needle 72 are kept in the ends of the nano needles 72 and holes transferred from the anode 74 to the intermediate layer 73 are injected into the ends of the nano needles 72. As a result, the electrons recombine with the holes at the ends of the nano needles 72, thereby generating light. Accordingly, the ends of the nano needles 72 form a light-emitting region 75.

Although the nano needles 72 are inserted into the cathode 71 as shown in FIG. 8, the nano needles 72 may be inserted into the anode 74. In this case, the intermediate layer 73 may be composed of a material having a large electron affinity and ionization energy such that holes cannot be emitted from the nano needles 72 and electrons flow easily into the nano needles 72 from the cathode 71.

Figure 9:
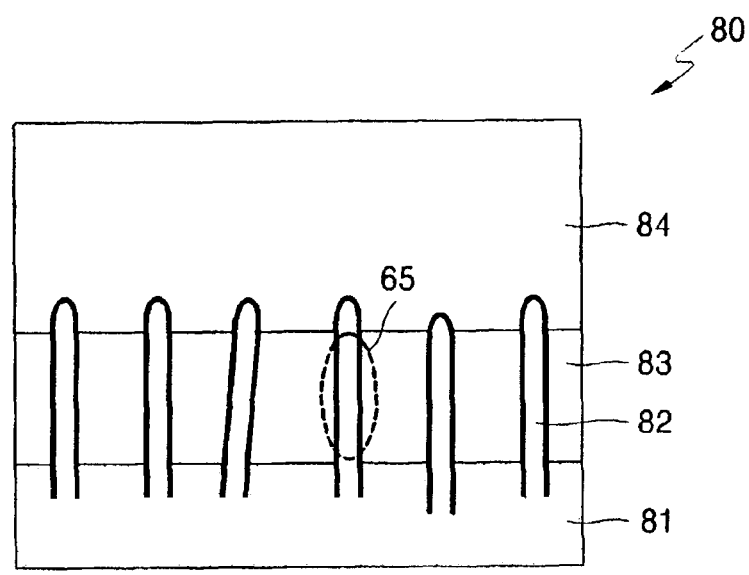
FIG. 9 is a cross-sectional view schematically illustrating a light-emitting device using nano size needles consistent with an embodiment of the present invention.

FIG. 9 illustrates another embodiment of the present invention in which nano needles are used to generate light. Referring to FIG. 9, ends of nano needles 82 contact a cathode 81 and an anode 84, respectively. In this case, an insulating layer 83 is interposed between the cathode 81 and the anode 84 and prevents the cathode 81 from directly contacting the anode 84. The insulating layer 83 may be composed of a general insulating material having a large ionization energy and a small electron affinity compared with the nano needle 82, for example, SiO2. In this configuration, electrons and holes are directly provided to the nano needle 82 via the cathode 81 and the anode 84, respectively. Accordingly, a light-emitting region 65 is approximately a middle portion of the nano needles 82 surrounded by the insulating layer 83, not the ends of the nano needles 82.

Various configurations of light-emitting devices according to exemplary embodiments of the present invention have been described. In the light-emitting device consistent with various embodiments of the present invention, one end of a nano needle is inserted into an electrode such as a cathode or an anode, and the rest of the nano needle is covered by an intermediate layer such as an emitting layer, a hole blocking layer, an electron blocking layer, an ETL, a HTL, or an insulating layer. In these configurations, the nano needles can easily provide electrons or holes to an emitting layer at a low applied voltage, or the nano needles themselves can emit light.

The nano needles can be formed on an electrode using various methods. For example, a carbon nano tube or a nano wire composed of, for example, ZnO can be vertically grown on an electrode using a chemical vapor deposition (CVD) method. An intermediate layer can be formed on the electrode using a spin coating method or a method of hardening a liquid material, thereby covering the nano needles. Also, the nano needles can be manufactured by scattering a powder or painting a paste on the electrode. In this case, although the direction of nano needles is irregular and the density of nano needles is not uniform a portion of the nano needles that are relatively perpendicular to the electrode can provide a sufficient number of electrons or holes. In the embodiments of the present invention illustrated in FIGS. 5A and 6B, when nano needles are formed on a light-emitting material, since the light-emitting material may be deteriorated by a temperature of approximately 500 to 600° C., which is required after CVD or painting, the nano needle structure is first deposited and then the light-emitting is formed.

Structures and operations of light-emitting devices according to embodiments of the present invention have been described in detail. Consistent with embodiments of the present invention, the electron injection efficiency of a light-emitting device can be greatly improved using nano needles. Accordingly, a light-emitting device in which driving voltage is low, power consumption is small, and brightness is high, can be provided. Also, heat generated by a light-emitting device can be minimized. Since the principal of the present invention, which is described above, can be applied to conventional organic EL devices or inorganic EL devices, a manufacturing process for realizing embodiments of the present invention is not complicated.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light-emitting device comprising:
   a first electrode having a first polarity;
   a second electrode having a second polarity opposite to the first polarity;
   a light-emitting layer interposed between the first electrode and the second electrode;
   a plurality of conductive needles inserted in the first electrode extending toward the light-emitting layer; and
   a hole blocking layer composed of a nonconductive material having a larger ionization energy than the light-emitting layer, said hole blocking layer being interposed between the first electrode and the light-emitting layer and surrounding the ends of the conductive needles to inhibit deterioration of the light-emitting layer and deter holes from transferring to the first electrode.

2. The light-emitting device of claim 1, wherein the diameter of the conductive needles is less than 100 nm.

3. The light-emitting device of claim 1, wherein the first electrode is a cathode, the second electrode is an anode, and at least one of the first electrode and the second electrode is a transparent electrode.

4. The light-emitting device of claim 1, wherein a distance between the interface of the light-emitting layer, and the hole blocking layer and the ends of at least some of the conductive needles, is less than 10 nm.

5. The light-emitting device of claim 1, wherein an electron blocking layer having a smaller electron affinity than the light-emitting layer is interposed between the light-emitting layer and the second electrode in order to deter electrons from transferring from the light-emitting layer to the second electrode.

6. The light-emitting device of claim 3, wherein an electron transporting layer composed of a conductive material having a larger ionization energy than the light-emitting layer is interposed between the first electrode and the light-emitting layer and surrounds the ends of the conductive needles in order to inhibit deterioration of the light-emitting layer, deter holes from transferring from the light-emitting layer to the first electrode, and improve electron injection efficiency from the first electrode to the light-emitting layer.

7. The light-emitting device of claim 6, wherein a hole transporting layer having a smaller electron affinity than the light-emitting layer is interposed between the light-emitting layer and the second electrode in order to deter electrons from transferring from the light-emitting layer to the second electrode and improve hole injection efficiency from the second electrode to the light-emitting layer.

* * * * *